(12) United States Patent
Halbig et al.

(10) Patent No.: US 11,728,607 B2
(45) Date of Patent: Aug. 15, 2023

(54) COUPLING DEVICE, ASSEMBLY AND METHOD

(71) Applicant: MD ELEKTRONIK GmbH, Waldkraiburg (DE)

(72) Inventors: Thomas Halbig, Dietfurt (DE); Hermann Kefer, Altoetting (DE)

(73) Assignee: MD ELEKTRONIK GMBH, Waldkraiburg (DE)

( * ) Notice: Subject to any disclaimer, the term of this patent is extended or adjusted under 35 U.S.C. 154(b) by 57 days.

(21) Appl. No.: 17/400,124

(22) Filed: Aug. 12, 2021

(65) Prior Publication Data
US 2022/0059980 A1  Feb. 24, 2022

(30) Foreign Application Priority Data
Aug. 24, 2020 (DE) ...................... 10 2020 122 020.0

(51) Int. Cl.
*H01R 12/51* (2011.01)
*H01R 43/02* (2006.01)
*H01R 12/53* (2011.01)
*H05K 1/18* (2006.01)

(52) U.S. Cl.
CPC ....... *H01R 43/0263* (2013.01); *H01R 12/515* (2013.01); *H01R 12/53* (2013.01); *H05K 1/18* (2013.01); *H05K 2201/10356* (2013.01); *H05K 2201/10393* (2013.01)

(58) Field of Classification Search
CPC .. H05K 5/0069; H05K 5/0247; H01R 12/716; H01R 12/515; H01R 9/0515
See application file for complete search history.

(56) References Cited

U.S. PATENT DOCUMENTS

| | | | |
|---|---|---|---|
| 4,797,112 A | 1/1989 | Weisenburger | |
| 5,186,638 A * | 2/1993 | Pusch | H01R 12/79 29/842 |
| 6,454,596 B1 * | 9/2002 | Montagano | H01R 13/5804 439/732 |
| 2009/0223041 A1 | 9/2009 | Garrison et al. | |
| 2012/0307462 A1 | 12/2012 | Chen et al. | |

FOREIGN PATENT DOCUMENTS

| | | |
|---|---|---|
| CN | 102811585 A | 12/2012 |
| EP | 3435482 A1 | 1/2019 |
| WO | WO 2011023286 A1 | 3/2011 |

* cited by examiner

*Primary Examiner* — Jeremy C Norris
(74) *Attorney, Agent, or Firm* — Leydig, Voit & Mayer Ltd.

(57) ABSTRACT

A coupling device for coupling a plurality of cable units to a component carrier includes a base plate that is flat in at least one plane. A connecting device is disposed on a first side of the base plate and is configured to mechanically couple the base plate to the component carrier. An opening extends through the base plate for each cable end of a plurality of cable ends of the cable units. The opening in each case is disposed on the base plate at a position corresponding to the respective cable unit.

21 Claims, 10 Drawing Sheets

COUPLING DEVICE, ASSEMBLY AND METHOD

CROSS REFERENCE TO RELATED APPLICATION

This application claims benefit to German Patent Application No. DE 10 2020 122 020.0, filed on Aug. 24, 2020, which is hereby incorporated by reference herein.

FIELD

The present invention relates to a coupling device for coupling a number of cable units to a component carrier, in particular to a carrier board. The present invention further includes a corresponding assembly and a corresponding method for manufacturing the assembly.

The present invention is described primarily in relation to multi-wire electrical cables, in particular stranded wire cables. Nevertheless, it is understood that the present invention may be used with any kind of cables.

BACKGROUND

Today, modern technical systems, such as vehicles, have a variety of electrical units incorporated therein. For reasons of efficiency, such electrical units may be preassembled and incorporated as modules into the respective technical system.

To this end, the individual modules are assembled prior to being incorporated into the technical system. In this context, typically different mechanical and electrical elements have to be incorporated or connected together. For example, a control unit for a vehicle may include a carrier board on which may be mounted various elements, such as controllers and associated peripherals, e.g., a power supply, and the like, connection terminals, connectors, cables, and the like. Such a carrier board may be disposed in a housing that encloses the carrier board and provides suitable mounting and connection options.

In the manufacture of such modules, the individual elements must be mounted on the carrier board, for example, soldered thereon. In particular, the attachment of cables to such a carrier board is a complex and error-prone process, for example, because cable ends may kink and thus become unable to be properly attached by soldering.

SUMMARY

In an embodiment, the present disclosure provides a coupling device for coupling a plurality of cable units to a component carrier. The coupling device includes a base plate that is flat in at least one plane. A connecting device is disposed on a first side of the base plate and is configured to mechanically couple the base plate to the component carrier. An opening extends through the base plate for each cable end of a plurality of cable ends of the cable units. The opening in each case is disposed on the base plate at a position corresponding to the respective cable unit

BRIEF DESCRIPTION OF THE DRAWINGS

Subject matter of the present disclosure will be described in even greater detail below based on the exemplary figures. All features described and/or illustrated herein can be used alone or combined in different combinations. The figures are merely schematic representations and serve merely to illustrate the invention. Identical or functionally equivalent elements are given the same reference numerals throughout. The features and advantages of various embodiments will become apparent by reading the following detailed description with reference to the attached drawings, which illustrate the following.

DETAILED DESCRIPTION

Embodiments of the present invention enable easy connection of cables to a component carrier.

In an embodiment, the present invention provides a coupling device for coupling a number of (i.e., one or more) cable units to a component carrier, the coupling device including: a base plate that is flat in at least one plane, a connecting device disposed on a first side of the base plate and configured to mechanically couple the base plate to the component carrier, and an opening extending through the base plate for each cable end of a number of (i.e., one or more) cable ends of the cable units, the openings being disposed on the base plate at a position corresponding to the respective cable unit.

In another embodiment, the present invention provides an assembly including: a number of cable units, each having a number of cable ends, a flat component carrier having a contact element for each of the cable ends, and a coupling device according to any of the preceding claims, the coupling device being disposed between the cable units and the component carrier and being mechanically coupled at least to the component carrier, and each of the cable ends extending through an opening of the coupling device to the respective contact element and being electrically coupled to the respective contact element.

In a further embodiment, the present invention provides a method for manufacturing an assembly, comprising the following steps: coupling a component carrier to a coupling device according to the invention, inserting cable ends into corresponding openings of the coupling device, and electrically coupling the cable ends to corresponding contact elements of the component carrier.

It has been realized, in accordance with embodiments of the present invention, that, in particular, the connection of cables to a component carrier such as, for example, a printed circuit board, is a very complex process. In such a connection process, it must be ensured that the individual ends of the cables are properly passed through the printed circuit board without kinking, and that they can then be attached by soldering. In addition, a strain relief should be provided to achieve a durable connection of the cables to the carrier board.

In order to allow cable units to be connected to a component carrier as easily as possible in an assembly according to an embodiment of the present invention, an embodiment of the present invention provides a coupling device. The coupling device serves to couple one or more cable units to a component carrier of the assembly.

The assembly may take the form of, for example, an electrical or electronic assembly having passive and/or active components. It is understood that the terms "electrical" or "electronic" are synonymous in the context of the present invention and may relate to both passive and active, analog and/or digital components. Such an assembly may be incorporated into, for example, a complex technical system, such as a vehicle, for example.

The component carrier of the assembly may have, for example, a carrier board on which electronic and/or mechanical components may be disposed.

In order to couple the cable units to the component carrier, the coupling device has a flat base plate. The term "flat" is understood to mean that the base plate has at least one flat section that extends in or parallel to a plane. It is understood that the base plate may have other elements that do not extend in this plane and, for example, stand out from the flat section.

The individual cable units each have a number of cable ends. In order to be able to couple the cable ends to the component carrier, the cable ends must be passed from the second side of the base plate opposite the first side to the first side of the base plate, which first side faces the component carrier. For this purpose, the base plate has an opening for each of the cable ends. The respective cable ends can be passed through these openings to the component carrier.

It is understood that the cable ends may be prepared accordingly. That is, the cable ends may, for example, be mechanically fixed in a predetermined position. This ensures that the cable ends are in the proper positions during insertion thereof into the openings.

The openings for the individual cable ends for a respective cable unit may be located on the base plate at a position corresponding to the respective cable unit and the respective cable end. This ensures that during connection of the coupling device to the respective cable unit, the cable ends can be passed through the openings and electrically connected to the component carrier.

On the first side of the base plate; i.e., the side facing the component carrier, the coupling device has a connecting device. The connecting device mechanically fixes the coupling device to the component carrier.

It is understood that the connecting device may have any suitable type of connecting elements. For example, the connecting device may establish a latching connection between the coupling device and the component carrier. For this purpose, the connecting device may have suitable latching nose elements or latching hook elements, while the component carrier may have corresponding openings or recesses with which the latching nose elements or latching hook elements may engage. It is understood that other suitable types of connection are also possible. For example, screw connections, press-fit or compression-fit connections, adhesive connections, or a combination of several of the aforementioned options may be provided.

In order to assemble an assembly according to an embodiment of the invention, first the component carrier may be mechanically connected to the coupling device by means of the connecting device. As a result, the openings in the base plate are located above the corresponding contact elements of the component carrier.

Subsequently, a cable unit may be inserted into the coupling device.

Finally, the cable ends may be electrically coupled to the contact elements, for example, by a soldering process. It is understood that the contact elements may be configured as, for example, vias on a printed circuit board.

Thus, use of the coupling device according to an embodiment of the invention enables cable units to be very easily and efficiently mechanically and electrically connected to a component carrier. In this context, the openings ensure that the cable ends are properly positioned and routed to the contact elements. Thus, in particular, the assembly can be manufactured in an automated manner and with high quality. For example, the coupling device allows the individual cable units to be very easily aligned. For this purpose, the coupling device may, for example, have corresponding positioning elements or positioning aids, as will be explained in detail below.

In an embodiment, the coupling device may include a coupling means for each of the cable units, each coupling means being disposed on a second side of the base plate opposite the first side and configured to receive and mechanically fix the respective cable unit in a corresponding receiving space.

On the second side of the base plate, a coupling means may be provided for at least one of the cable units. The second side of the base plate is the side of the flat section of the base plate on which the cable units are disposed. In contrast, as explained earlier, the first side refers to the side of the flat section of the base plate that faces the component carrier when the assembly is in the assembled state.

The coupling means are used to mechanically fix the respective cable units in a predetermined position. For this purpose, the coupling means may define a receiving space for each of the cable units, in which receiving space the respective cable unit is received and fixed. To this end, the coupling means may, for example, be arranged around the receiving space or at its edge or circumference. It is understood that the receiving space does not need to be sealed or completely enclosed.

For example, the coupling means may establish a latching connection with the cable units. For this purpose, the coupling means may have corresponding latching nose elements or latching hook elements. The cable units may have corresponding latching projections or latching recesses with which the latching nose elements or latching hook elements may engage.

In another embodiment, the coupling means may take the form of separate elements which are insertable connector elements that can be installed around or at the respective receiving space and which, for example, latch into engagement with the base plate.

The coupling means fix the cable units and the connecting device fixes the component carrier to the coupling device. Thus, a mechanical unit is formed which additionally provides a strain relief for the electrical connections between the contact elements and the cable ends.

In a further embodiment, the coupling device may have at least one mechanical positioning element that is configured to enable coupling of the connecting device to the component carrier only when the coupling device is disposed in a predetermined position on the component carrier.

The mechanical positioning element ensures that the coupling device and the component carrier are coupled to each other only when in a predetermined position relative to each other. This prevents improper installation of the coupling device on the component carrier.

Thus, the mechanical positioning element implements the so-called "poka-yoke" principle for the coupling device, in which technical precautions and features are provided for detecting and avoiding faults. The "poka-yoke" principle is implemented in the coupling device in the sense that the coupling device includes a positioning element in some regions thereof, the positioning element having one or more elements and being configured and arranged in relation to the component carrier in such a way that attachment of the coupling device to the component carrier is only possible in a defined desired position. The mechanical positioning element prevents improper installation of the coupling device since the connecting device cannot be coupled to the component carrier as long as it is positioned incorrectly, i.e. differently from the defined desired position in relation to the component carrier. Furthermore, such an attempt would be detected immediately since the coupling device would, for example, only lie loosely on the component carrier.

The mechanical positioning element may have one or more elements for this purpose. These elements may, for example, interact with the component carrier in such a way that coupling of the component carrier to the coupling device is only possible in the predetermined position.

For example, the mechanical positioning element may have pins extending toward the component carrier on the first side of the base plate. The component carrier may be provided with corresponding openings for receiving the pins. The length of the pins is selected such that the coupling device can only be placed on the component carrier and fixed with the connecting device if the pins are properly positioned; i.e., if the pins can move into the openings. If the coupling device is placed in an improper position on the component carrier, the pins will abut against the surface of the component carrier and prevent the coupling device from being coupled to the component carrier.

In an embodiment, the mechanical positioning element may also be integrated into the connecting device. As already explained above, the connecting device may provide for latching nose elements or screw connections, for example. If the mechanical positioning element is integrated into the connecting device, these latching nose elements or screw connections or the like can be suitably positioned such that improper installation is impossible.

It is understood that the mechanical positioning element may, for example, have three or more elements that prevent improper installation. If only two such elements were provided, the coupling device could possibly be mounted rotated by 180°. This can be effectively prevented by using three or more such elements.

In yet another embodiment, the coupling device may have a receiving-space boundary, e.g., a collar on the base plate, for each of the receiving spaces, each of the receiving-space boundaries in particular having a unique predetermined geometry.

The receiving-space boundaries may at least partially surround the respective receiving space. For example, the receiving-space boundaries may rise from the base plate as a projection or collar on the second side thereof, forming a kind of wall or peripheral rim around the respective receiving space. It is understood that the individual receiving-space boundaries may be integrally formed in one piece; i.e., that they may together surround the receiving spaces.

Thus, the receiving-space boundaries at the same time form a guide that guides the cable units into the proper position as they are positioned on the base plate.

It is understood that the coupling means may be formed integrally with the receiving-space boundaries. In such an embodiment, for example, latching nose elements or latching hook elements may be provided in the receiving-space boundary.

In an embodiment, the individual receiving-space boundaries may have a unique predetermined geometry. Thus, each of the receiving spaces has an individual geometry. The cable units may have a geometry corresponding to the respective receiving space. Thus, only matching cable units can be inserted into the respective receiving spaces. Furthermore, the geometries of the receiving spaces may be asymmetrical. This can also prevent the cable units from being inserted at an improper rotational orientation.

Thus, in this embodiment, the "poka-yoke" principle is also implemented for the coupling of the cable units to the base plate.

In yet another embodiment, the openings in the base plate may taper in cross section from the second side to the first side.

As already explained above, the openings serve to guide the cable ends of the individual conductors of the cable unit and thereby position them on the contact elements of the component carrier.

If openings having a tapered cross section are provided, these openings have a larger cross section on the second side of the base plate than on the first side of the base plate. The openings may, for example, be funnel-shaped.

The individual openings therefore serve as guides for the individual cable ends, since the cable ends are received via a larger cross section and then slide along the inclined inner surface into the proper position if they are not accurately centered over the openings. In this connection, the positioning accuracy is defined by the cross section of the opening on the first side of the component carrier.

The contact elements of the component carrier may take the form of, for example, vias or holes through which the cable ends are passed for attachment by soldering. The tapered openings therefore allow the cable ends to be accurately positioned over the holes.

Thus, during assembly of the cable units with the coupling device and the component carrier, it is ensured that the cable ends are accurately positioned and, for example, will not kink.

In a further embodiment, each of the openings may have a stop at its end located on the first side of the base plate.

The stop may take the form of, for example, a projection or edge. For example, the cross section of the opening may be reduced orthogonally to the main direction of extension thereof at a point proximate to the first side of the base plate. Such a stop may serve, for example, as an engagement surface for an end edge of a sheath of a stripped cable end.

The cable ends may, for example, each have a stripped end portion from which the sheath has been removed. This stripped end portion may be adjoined by an insulated portion from which the sheath was not removed. Consequently, when a cable unit is positioned on the coupling device, the stripped end portion extends through the component carrier, and an end of the insulated portion, namely the end edge of the sheath that was created during the stripping operation, rests against the engagement surface.

In another embodiment, the coupling device may have a number of (i.e., one or more) spacer elements arranged on the first side of the base plate and having a predetermined thickness.

The spacer elements are used to set the distance between the base plate and the component carrier to a predetermined amount and to prevent this distance from being reduced. To this end, the spacer elements may have a thickness corresponding to the predetermined distance.

Such spacer elements may take the form of, for example, projections on the first side of the base plate. Additionally or alternatively, spacer elements may also be integrated into the connecting device. For example, latching elements of the connecting device may have corresponding abutments.

During a soldering process in which the cable ends are soldered to the component carrier on the bottom side thereof, an amount of built-up material, also referred to as a solder bump, is also formed on the top side; i.e. the side facing the coupling device, due to capillary action. The predetermined distance ensures that there will be no impairment of the soldered connection and that there will be no contact between the solder and the coupling device.

In an embodiment, the coupling device may have a number of (i.e., one or more) covering devices originating at and extending away from the base plate.

The covering devices are used to at least partially cover or shield elements that are disposed on the component carrier on its side facing the coupling device. For this purpose, the covering devices may be configured according to the particular application or according to the shape of the component carrier and the position of the respective elements.

The covering devices may, for example, have a main direction of extension lying in the plane of the base plate. It is understood that the covering devices may also have complex three-dimensional shapes in order, for example, to receive elements which rise from the component carrier into corresponding recesses.

Thus, the covering devices make it possible to protect elements in such a way that, for example, a separate housing for the assembly can be dispensed with.

In yet another embodiment, the coupling device may have a number of (i.e., one or more) fastening elements configured to mechanically couple the coupling device to an external receptacle.

The fastening elements may take the form of, for example, latching-type connecting elements such as, for example, latching hook elements or latching nose elements. The fastening elements may alternatively take the form of recesses capable of receiving corresponding latching-type connecting elements of the external receptacle. It is understood that other types of fastening elements, such as threaded connecting elements, are also possible. It is further understood that different types of fastening elements may be combined.

The fastening elements are used to mount the coupling device, together with the cable units and the component carrier; i.e., the entire assembly, in the final application. The fastening elements may therefore be arranged on the base plate in such a way that they point outward from the region that receives the cable units.

If there are side walls or collars defining the regions that receive the cable units, the fastening elements may be disposed, for example, on the outside of these side walls or collars.

A technical system that receives the assembly may be configured such that the assembly is held in the desired position by means of the fastening elements. The receptacle in the technical system may be configured in a housing-like manner so that the receptacle at least partially encloses or covers the assembly. This eliminates the need for a separate housing for the assembly.

In yet another embodiment, the coupling device may have a number of (i.e., one or more) shielding openings for at least one of the cable units, the shielding openings extending through the base plate and being configured to receive contacts of a shield of the at least one cable unit.

Depending on the type of cables and data transmission systems used, it may be necessary to shield the cables. In such cases, the ends of the cable units that are connected to the coupling device may also be shielded. The shields of the cable units may take the form of, for example, suitable sheet-metal covers which are pressed onto the ends of the cable units. Such sheet-metal covers typically have contact pins to electrically contact the shield. The shielding openings may therefore be configured such that the contact pins extend through the coupling device to the component carrier. The contact pins can then be attached to the component carrier, for example by soldering.

In an embodiment, the coupling device may be a single-piece molded part, in particular a single-piece plastic part, specifically a single-piece injection-molded plastic part, which, as a multi-functional component, preliminarily secures the printed circuit board; i.e., the component carrier, at its edge and has openings or holes through which the contacts; i.e., the cable ends, of the multi-wire cable units can be passed. Furthermore, latching means may be provided on the inner wall of the multi-functional component to secure housings of the cable units in place.

In an embodiment, the coupling device may take the form of a three-dimensional molded plastic part with a flat bottom surface that maintains a predetermined distance from the flat printed circuit board; i.e., the component carrier, and with side surfaces protruding therefrom to bound the plastic material or for purposes of alignment, also called keying. The four side surfaces surround a receiving space within which may be received the overmolded ends of the multi-wire cable, which ends may be held in a so-called wire collector. Substantially horizontal sections may point away from the side surface, for example as light shields and/or as a cover for, for example, housings of components or connectors, such as USB connectors. There may be provided integral formations pointing from the side surface toward the component carrier, in particular toward the printed circuit board, the formations forming inwardly pointing retainers such as, for example, latching hooks or latching noses, for the edge of the printed circuit board.

Figure 1:
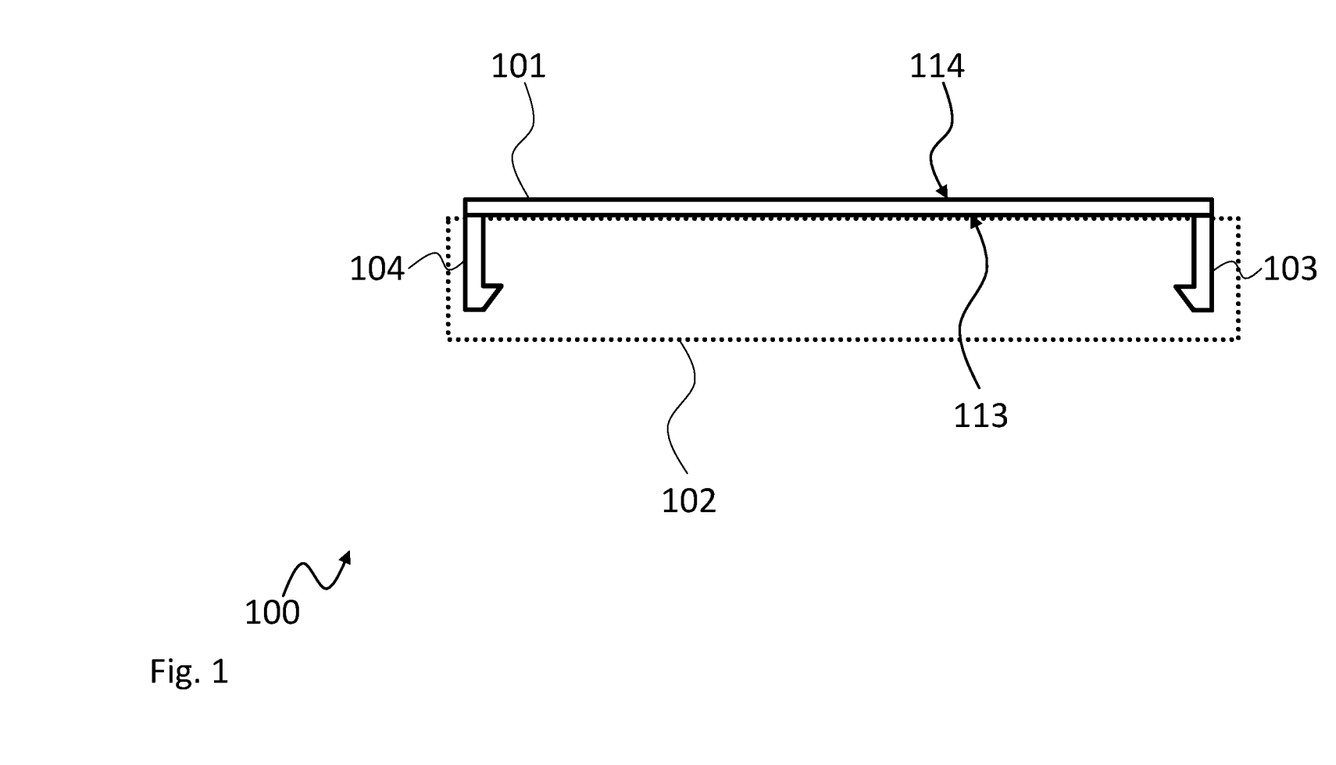
FIG. 1 is a side view of an embodiment of a coupling device in accordance with the present invention.

FIG. 1 shows a side view of a coupling device 100. Coupling device 100 can be provided and used as an aid for coupling a number of cable units to a component carrier, in particular a printed circuit board.

Coupling device 100 has a base plate 101 that is flat in at least one plane. A connecting device 102 is disposed on a first side 113 of base plate 101. Connecting device 102 is suitable for mechanically coupling base plate 101 to the component carrier. To this end, connecting device 102 of coupling device 100 has latching hooks 103, 104 (see FIG. 1), 105, 106 (see FIG. 2) which may, for example, suitably interlockingly engage with a corresponding component carrier. It is understood that this principle can also be reversed and connecting device 102 may, for example, have corresponding recesses which connecting devices disposed on the component carrier may engage. Further, connecting device 102 may also have, for example, holes for receiving screws or other fastening means.

In order to be able to couple cable units to the component carrier via coupling device 100, the component carrier is coupled to coupling device 100 via the connecting device. Furthermore, for each cable end of the cable units, a corresponding opening 107, 108, 109, 110, 111, 112 extends through base plate 101, each opening being configured as a through-hole penetrating base plate 101. These openings are 107, 108, 109, 110, 111, 112 are not visible in the side view of FIG. 1, but are shown in the plan view of FIG. 2.

Figure 2:
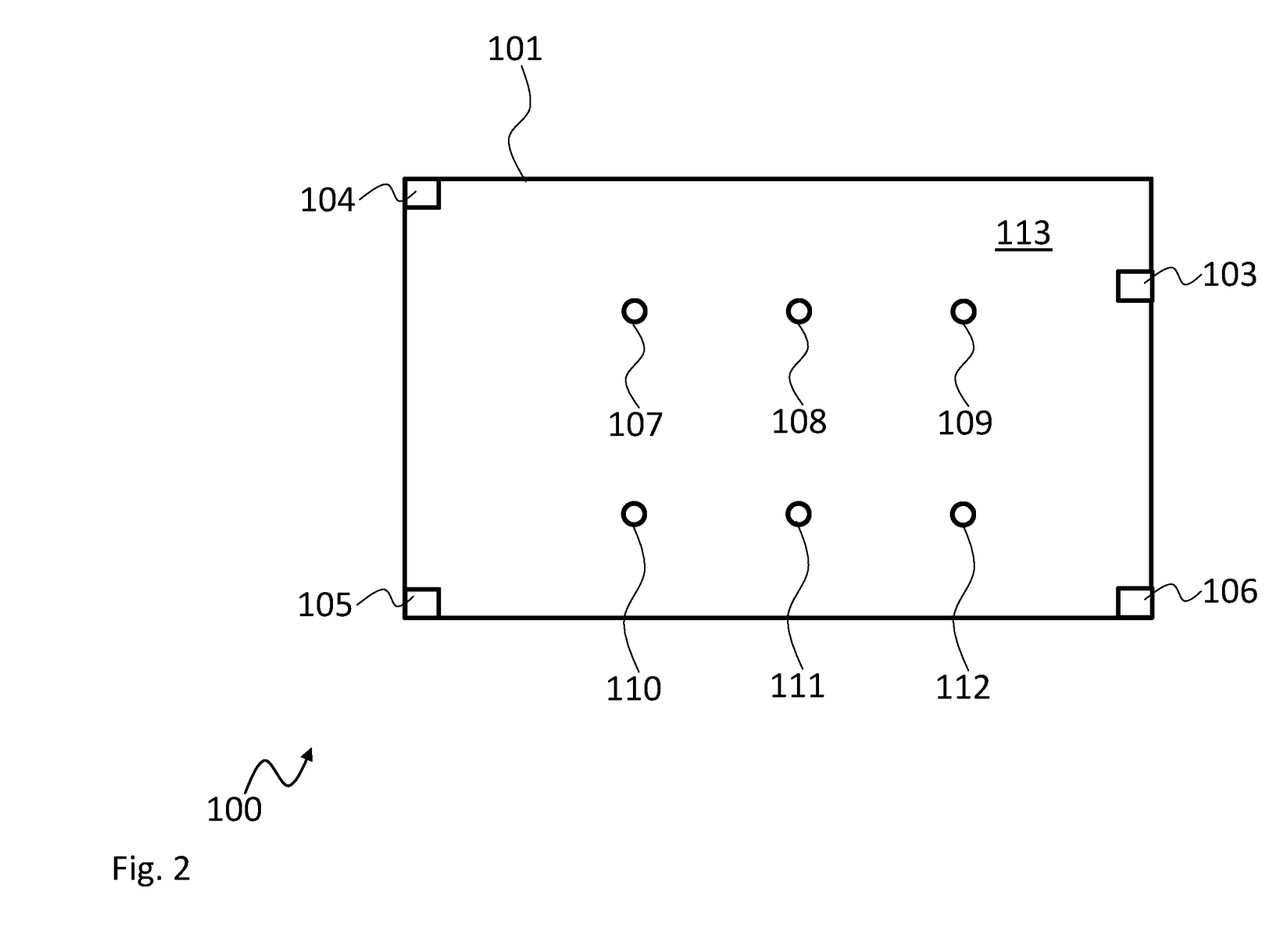
FIG. 2 is a plan view of the first side of the embodiment of the coupling device of FIG. 1.

In embodiments, the individual openings 107, 108, 109, 110, 111, 112 may have a cross section that tapers from second side 114 to first side 113. Openings 107, 108, 109, 110, 111, 112 may be configured like, or in the shape of, a funnel, or conically. When a cable end is inserted into one of the openings 107, 108, 109, 110, 111, 112, the respective cable end is received via the larger diameter of opening 107, 108, 109, 110, 111, 112 on second side 114. Therefore, in case the cable end is not accurately centered in opening 107, 108, 109, 110, 111, 112, the cable end slides along the tapered side wall of the opening. Openings 107, 108, 109, 110, 111, 112 thus act as positioning aids during insertion of cable ends into openings 107, 108, 109, 110, 111, 112.

This allows for an accurate and readily automatable installation of the cable units in an assembly.

As will described in more detail below, for example, with reference to FIGS. 3 and 4, coupling device 100 may also have additional elements which serve to receive, secure and/or position the cable units.

FIG. 2 shows a plan view of first side 113 of coupling device. 100.

It can be seen in the plan view of coupling device 100 that openings 107, 108, 109, 110, 111, 112 are arranged in two parallel rows, each including three openings 107, 108, 109 and 110, 111, 112, respectively. It is understood that this arrangement of openings 107, 108, 109, 110, 111, 112 was chosen merely by way of example, and that any other suitable arrangement of openings 107, 108, 109, 110, 111, 112 is also possible. In particular, openings 107, 108, 109, 110, 111, 112 may be arranged according to the positions of corresponding cable ends at the cable units. It is also understood that the individual openings 107, 108, 109, 110, 111, 112 may have different diameters and/or contours. It is further understood that openings for receiving cable ends of more than one cable unit may be provided.

Latching hooks 103, 104, 105, 106 are arranged asymmetrically on base plate 101. Latching hooks 103, 106 are disposed at the right edge of base plate 101 and latching hooks 105, 106 at the left edge of base plate 101. The distance between latching hooks 103, 104 is less than the distance between latching hooks 105, 106. Corresponding counterparts for latching hooks 103, 104, 105, 106 may be arranged at corresponding distances on a component carrier. The positions of latching hooks 103, 104, 105, 106 therefore do not allow coupling device 100 to be improperly installed on a component carrier. Latching hooks 103, 104, 105, 106 thus also perform the function of a mechanical positioning element that implements the so-called "poka-yoke" principle. It is understood that, additionally or alternatively, a separate mechanical positioning element may be provided.

Figure 3:
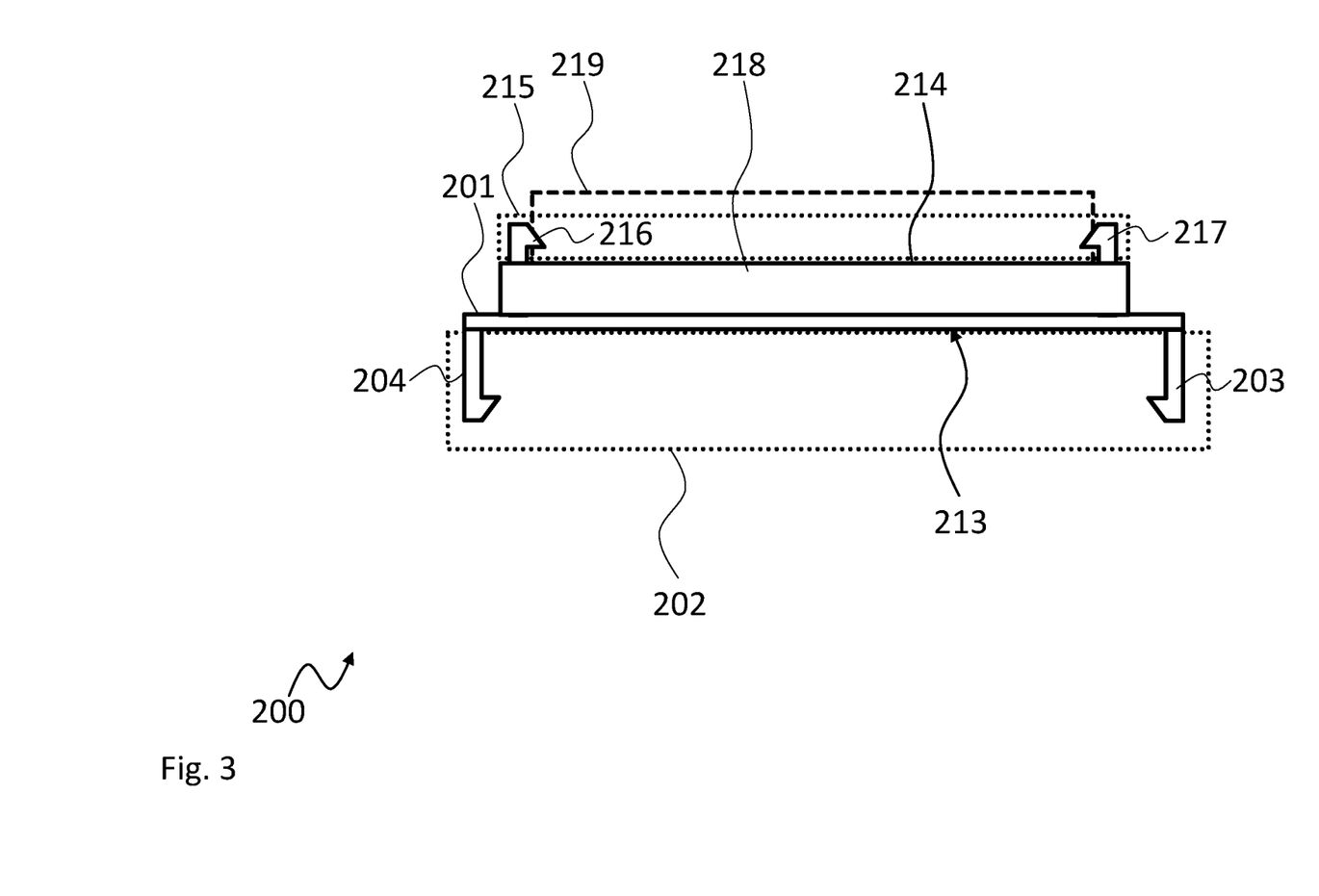
FIG. 3 is a side view of an embodiment of another coupling device in accordance with the present invention.

FIG. 3 shows a side view of another exemplary embodiment of a coupling device 200 according to the invention. Coupling device 200 is based on coupling device 100 in the sense that the first exemplary embodiment of an inventive coupling device 100 illustrated in FIGS. 1, 2 has been further refined. Thus, what has been described above for coupling device 100 applies analogously. Coupling device 200 also has a base plate 201 that is flat in at least one plane. On a first side 213 of base plate 201, there is disposed a connecting device 202 that is suitable for mechanically coupling base plate 201 to a component carrier. To this end, connecting device 202 has four latching hooks, as in other embodiments, including latching hooks 203, 204 (see FIG. 3) which may, for example, suitably interlockingly engage with the component carrier.

Coupling device 200 further has a coupling means 215 on second side 214 for receiving a cable unit in a corresponding receiving space 219. To this end, coupling means 215 of coupling device 200 has two latching hooks 216, 217 capable of latching into engagement with a cable unit. Further provided is a receiving-space boundary 218 which surrounds receiving space 219 and for this purpose at least partially extends around and bounds receiving space 219 along the edge thereof. To this end, receiving-space boundary 218 projects above second side 214 of base plate 201, and more specifically at least along a portion or portions of the edge of base plate 201 substantially vertically in some regions thereof.

Coupling device 200 is configured to mechanically couple at least one cable unit, in particular two or more cable units in correct positional relationship to each other to base plate 201. For this purpose, the at least one cable unit may, for example, have corresponding counterparts for latching hooks 216, 217, with which these latching hooks can engage. It is understood that the principle can also be reversed here and the latching elements may be provided in the cable unit. In such an embodiment, coupling means 215 may, for example, have corresponding recesses. Although only one coupling means 215 is shown, it is understood that additional coupling means are possible to receive additional cable units.

Figure 4:
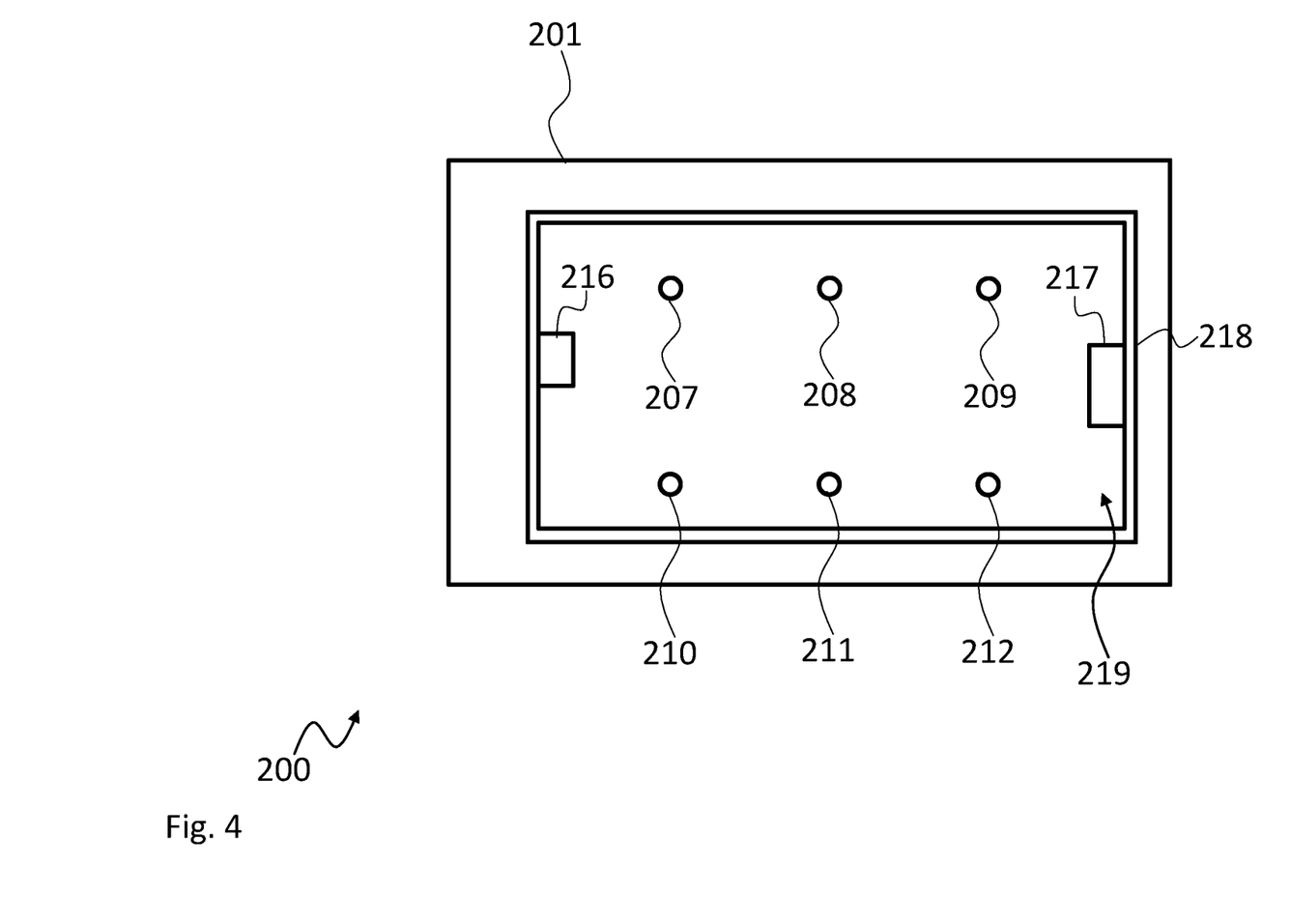
FIG. 4 is a plan view of the second side of the embodiment of the coupling device of FIG. 3.

FIG. 4 shows a plan view of second side 214 of the coupling device 200 of FIG. 3. In FIG. 3 it can be seen that coupling means 215 may also be configured to mechanically prevent improper installation of the cable unit; i.e., to implement the "poka-yoke" principle. For this purpose, two latching hooks 216, 217 are configured with different dimensions so that one latching hook, 217, for example, does not fit into a receptacle for the other latching hook 216. Furthermore, latching hooks 216, 217 are arranged asymmetrically with respect to a central axis of receiving space 219. Therefore, a particular cable unit to be secured by means of latching hooks 216, 217 can only be secured in a defined way in receiving space 219. Consequently, the aforementioned cable unit cannot be improperly inserted into receiving space 219. Thus, improper installation of a cable unit is effectively prevented, which makes it possible, in particular, also to install large numbers of cable units in an automated manner in a short process time.

It is understood that if there are several cable units and corresponding coupling means, they may have different mechanical designs, so that a cable unit can only be inserted into the receiving space that is defined by the respective coupling means.

Figure 5:
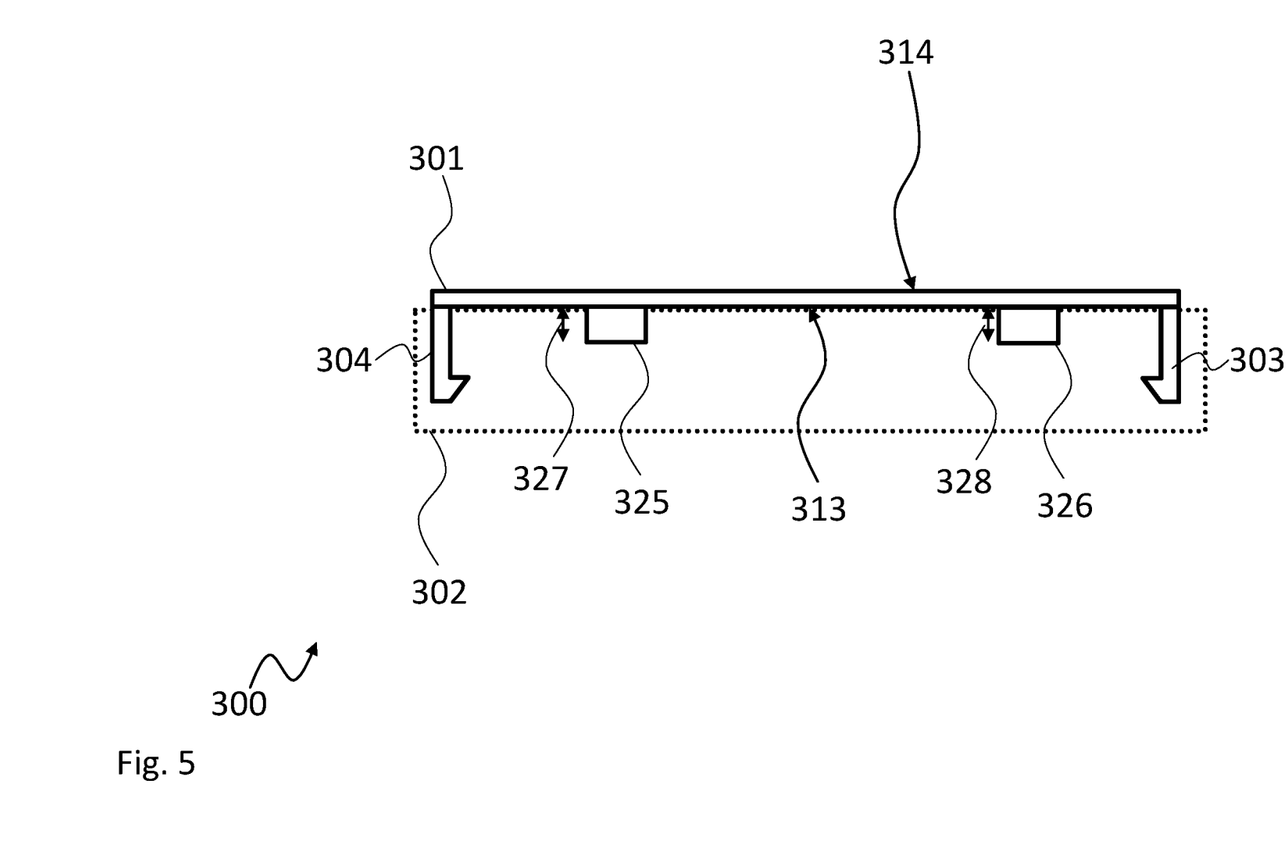
FIG. 5 is a side view of a further embodiment of a coupling device in accordance with the present invention.

FIG. 5 shows a side view of a third exemplary embodiment of a coupling device 300 according to the invention. Coupling device 300 is also based on coupling device 100 in the sense that it structurally refines the first coupling device 100 illustrated in FIGS. 1, 2. Thus, what has been described above for coupling device 100 applies analogously. Coupling device 300 also has a base plate 301 that is flat in at least one plane. On a first side 313 of base plate 301, there is disposed a connecting device 302 that is suitable for mechanically coupling base plate 301 to a component carrier. To this end, connecting device 302 has four latching hooks 303, 304 (see FIG. 5), 305, 306 (see FIG. 6) which may, for example, suitably interlockingly engage with the component carrier.

Coupling device 300 further has two spacer elements 325, 326 having a predetermined thickness 327, 328; i.e., a predetermined extent in a direction perpendicular to the plane of first side 313 of base plate 301. Spacer elements 325, 326 serve as a support for the component carrier and as a means for maintaining the distance from the component carrier, preventing the distance between the top side of the component carrier and a bottom side of base plate 301 from being less than the predetermined thickness 327, 328.

Figure 6:
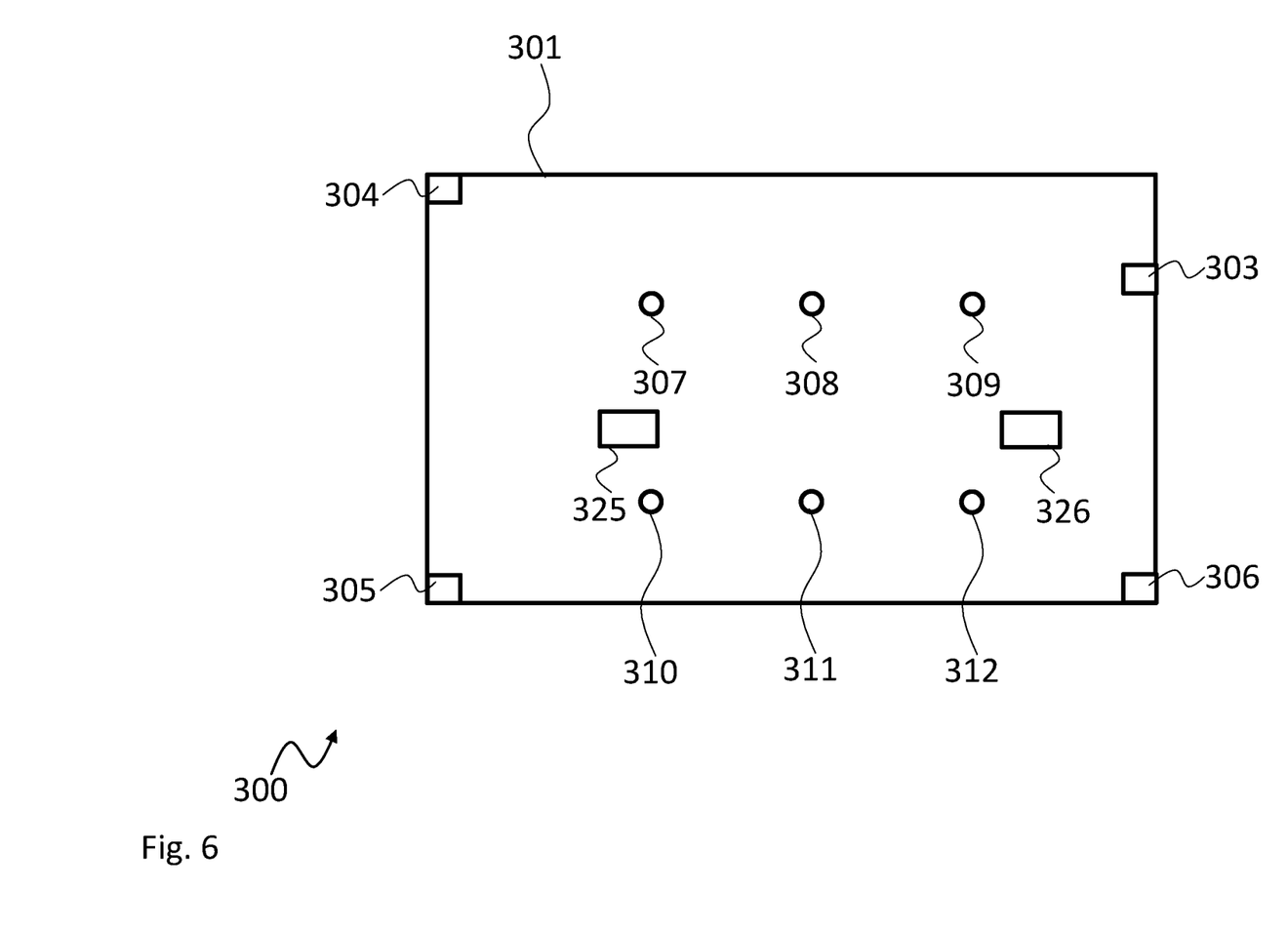
FIG. 6 is a plan view of the first side of the embodiment of the coupling device of FIG. 5.

FIG. 6 shows a plan view of first side 313 of coupling device 300. Spacer element 325 is disposed between openings 307 and 310, and spacer element 326 is disposed to the right of the connecting line between openings 309, 312. It is understood that the position and number of spacer elements 325, 326 were chosen here merely by way of example. In other exemplary embodiments, the number of spacer elements and/or the positioning of the spacer elements on base plate 301 may differ from the exemplary embodiment illustrated in FIGS. 5, 6. In another modification of the third exemplary embodiment shown in FIGS. 5, 6, the spacer elements may, for example, also be structurally integrated into connecting device 302 (FIG. 5) and may, for example, be configured as integral formations on latching hooks 303, 304, 305, 306.

Figure 7:
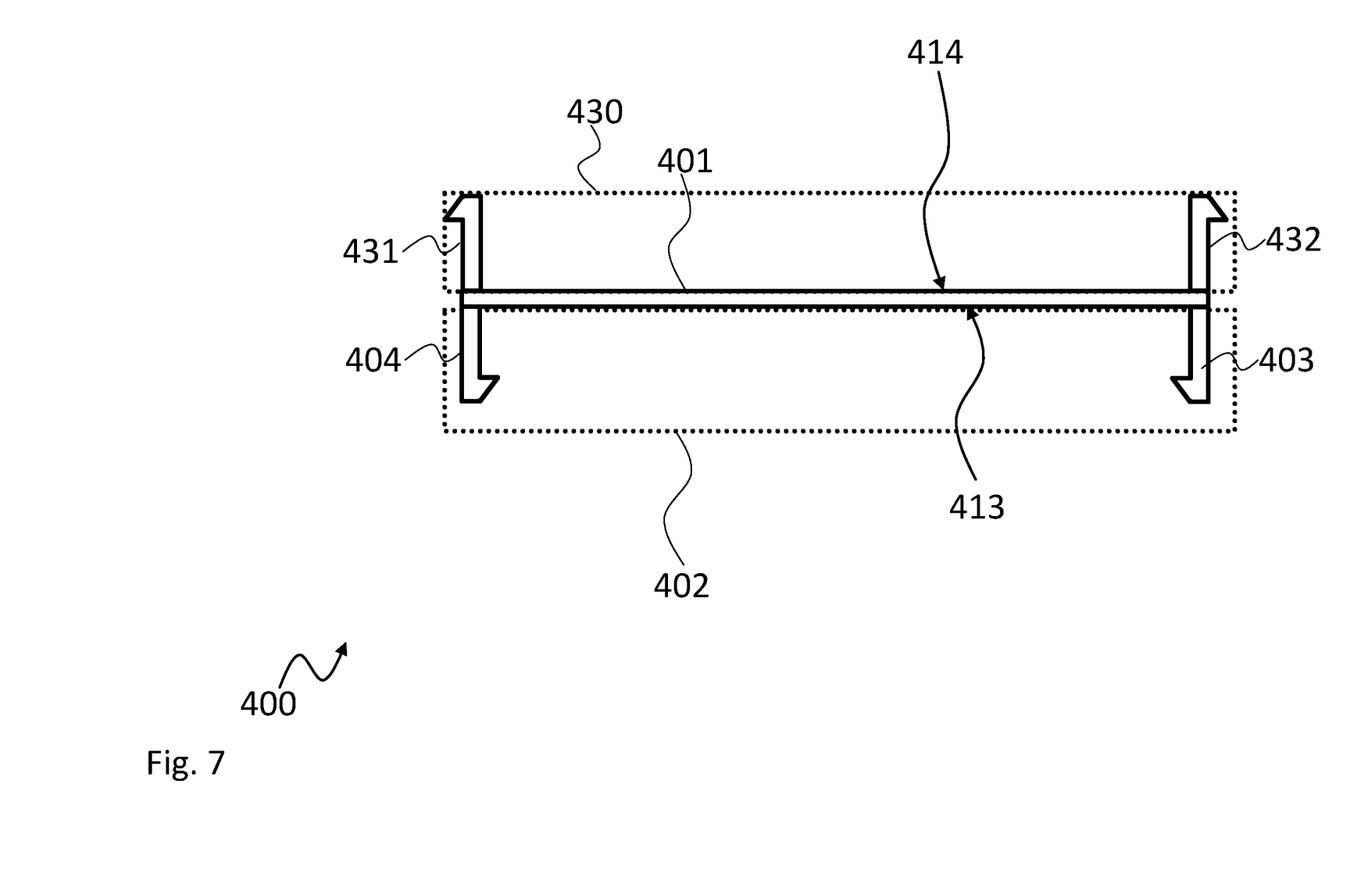
FIG. 7 is a side view of a further embodiment of a coupling device in accordance with the present invention.

FIG. 7 shows a side view of fourth exemplary embodiment of a coupling device 400 according to the invention. Coupling device 400 is based on coupling device 100 in the sense that fourth coupling device 400 constitutes a structural refinement of first coupling device 100. Thus, what has been described above for coupling device 100 applies analogously. Coupling device 400 also has a base plate 401 that is flat in at least one plane. On a first side 413 of base plate 401, there is disposed a connecting device 402 that is suitable for mechanically coupling base plate 401 to a component carrier. To this end, connecting device 402 has four latching hooks 403, 404, 405, 406 which may, for example, suitably interlockingly engage with the component carrier.

Coupling device 400 further has a fastening element 430 which serves to secure coupling device 400 externally, for example, to install it in the respective application. In the illustrated exemplary embodiment of coupling device 400, fastening element 430 has two latching hooks 431, 432.

In the case of the latching hooks 403, 404 of connecting device 402, the noses point toward each other; i.e., point inwardly. Unlike latching hooks 403, 404 of connecting device 402, the noses of latching hooks 431, 432 point away from each other, i.e., each point outwardly. Thus, latching hooks 431, 432 can very easily engage with corresponding recesses in a corresponding installation location. Therefore, there is no need to additionally secure an assembly created with coupling device 400.

It is understood that recesses for latching hooks or other fastening means may also be provided instead of latching hooks 431, 432.

It is understood that varying embodiments of a coupling device may combine features of the various embodiments of FIGS. 1 through 7. For example, a coupling device may have a coupling means with or without a receiving-space boundary and/or spacer elements and/or at least one fastening element.

Figure 8:
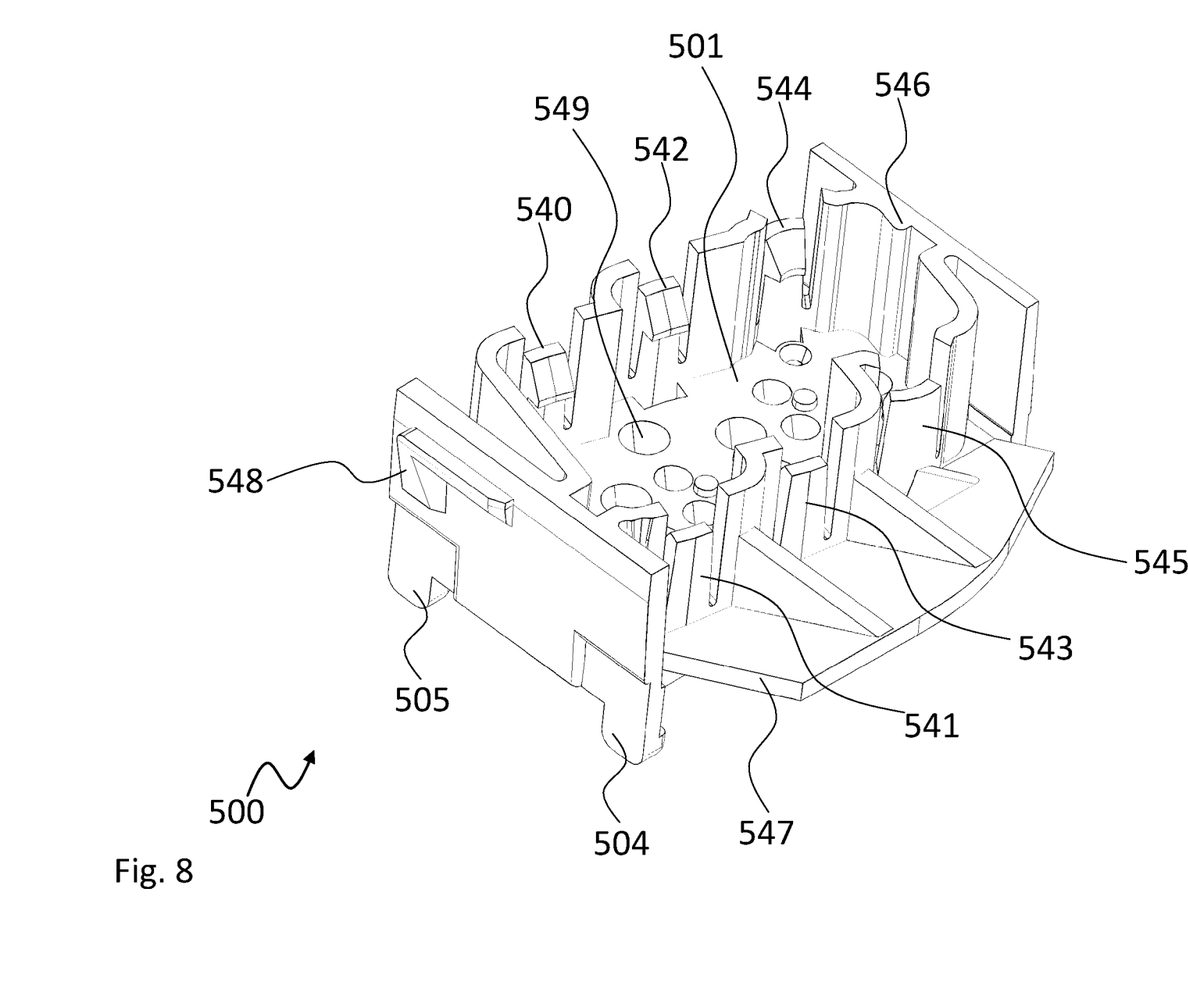
FIG. 8 is a perspective view of another embodiment of a coupling device in accordance with the present invention.

FIG. 8 shows a perspective view of a fifth exemplary embodiment of a coupling device 500 according to the invention. Coupling device 500 has a base plate 501. On the second side; i.e., the top side of base plate 501, a circumferential receiving-space boundary 546 is provided for three receiving spaces. The receiving spaces are not separated by receiving-space boundary 546 at the common surfaces, so that two adjacent receiving spaces merge into one another at the imaginary common surface. At two opposite edges of base plate 501, receiving-space boundary 546 has two walls rising vertically from base plate 501 above the respective edges. Each of these walls has provided thereon a fastening element 548 in the form of a projection. The projection and the respective wall together form a recess or space with which, for example, a latching hook may engage so as to secure coupling device 500 or a corresponding assembly externally. Further, a planar covering device 547 extends from a third edge of base plate 501. Covering device 547 serves to cover a component carrier and the components disposed on the component carrier. Planar covering device 547 extends away from base plate 501 at an in particular flat angle with respect thereto, so that the distance between the component carrier and planar covering device 547 increases away from the edge of base plate 501. It is understood that the shape and positioning of covering device 547 may be matched to the components of the respective component carrier. On the first side of base plate 501; i.e., the side facing downward in FIG. 8, there are provided latching hooks 504, 505 for a connecting device to receive and secure a component carrier (see FIG. 9). It is understood that in addition to the two visible latching hooks 504, 505, further latching hooks, in particular two further latching hooks, may be provided.

In coupling device 500, the latching hooks 540, 541, 542, 543, 544, 545 for three coupling means are integrated into receiving-space boundary 546. To this end, latching hooks 540, 541, 542, 543, 544 have noses which project into the corresponding receiving spaces and may engage with correspondingly shaped cable units. In base plate 501; i.e., at the bottom of the respective receiving spaces, there are provided openings for the ends of cables of the respective cable units. For the sake of clarity, only one of the openings is provided with a reference numeral '549'. Openings 549 are formed as through-holes penetrating base plate 501 and have a conical or tapered cross section, so that they serve as positioning aids during insertion of the cable ends, as explained above with reference to FIG. 1.

Figure 9:
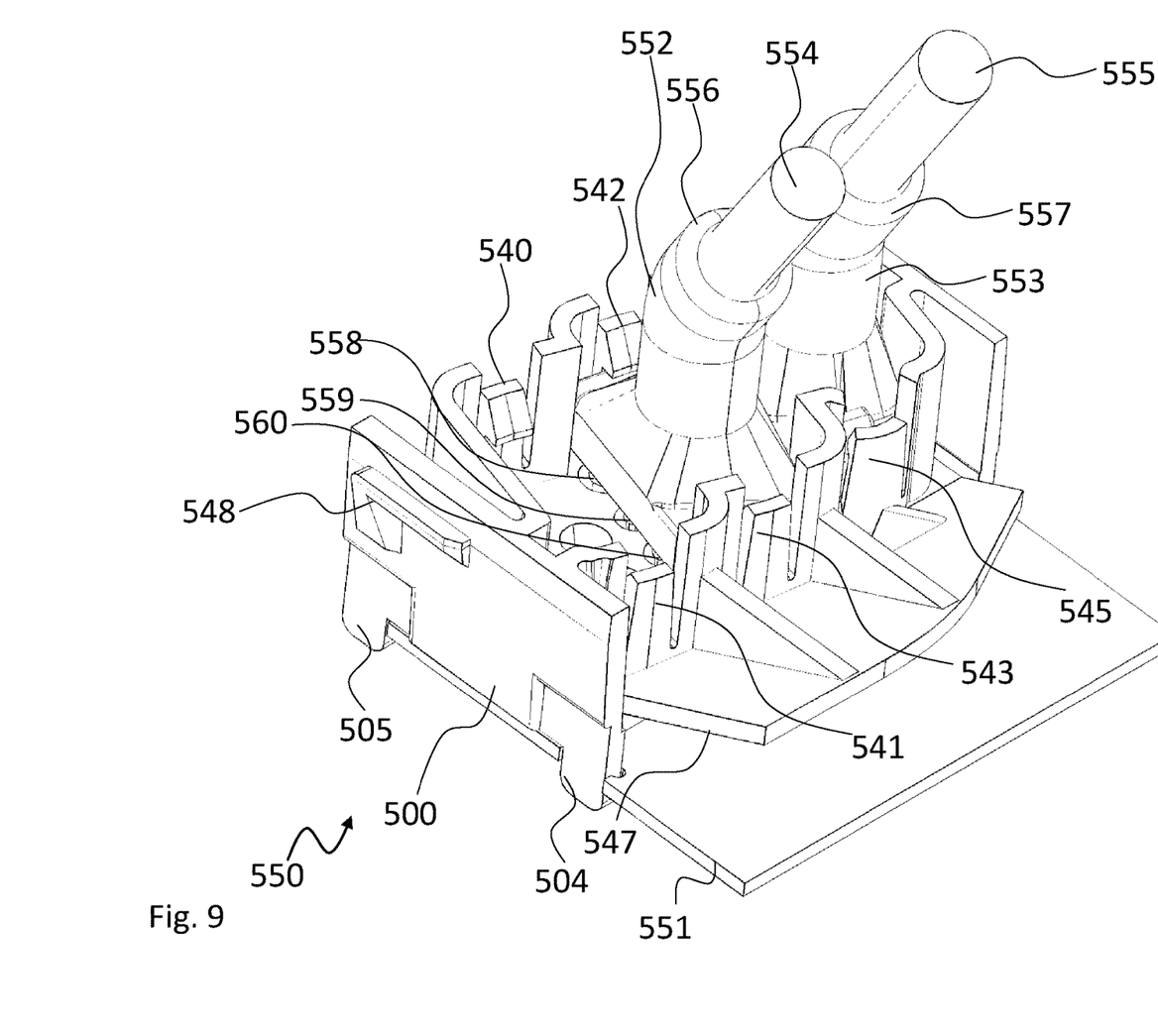
FIG. 9 is a perspective view of an embodiment of an assembly in accordance with the present invention.

FIG. 9 shows a perspective view of an exemplary embodiment of an inventive assembly 550 with the coupling device 500 according to FIG. 8. Assembly 550 includes coupling device 500 and a component carrier 551, in particular in the form of a printed circuit board. In assembly 550, coupling device 500 is coupled to component carrier 551 so that component carrier 551 is fixedly connected to coupling device 500 to the extent that assembly 550 can be further processed as a preassembled unit. Component carrier 551 was inserted into the connecting device from below or from the first side and is secured by latching hooks 504, 505 and the other latching hooks that are not visible.

Two cable units 552, 553 are shown from above; i.e., from the second side. Cable units 552, 553 are inserted in the receiving spaces of latching hooks 542, 543 and 544, 545. It is understood that a cable unit may also be inserted into the receiving space that is identified by latching hooks 540, 541. Cable units 552, 553 each have a jacket 556, 557, e.g., an injection-molded jacket, at their end, which serves as a positioning unit and mechanical connecting element and surrounds and jackets the respective cable 554, 555 near an end portion. Jackets 556, 557 are configured such that they can be inserted into the respective receiving space and latched into engagement with latching hooks 542, 543, 544, 545 there.

Each of the cable units 552, 553 has a number of cable ends 558, 559, 560. Three cable ends 558, 559, 560 of cable unit 552 are visible in FIG. 9. The cable ends 558, 559, 560 of the cable units are located in the openings of base plate 501 and electrically coupled to corresponding contact elements of component carrier 551.

Figure 10:
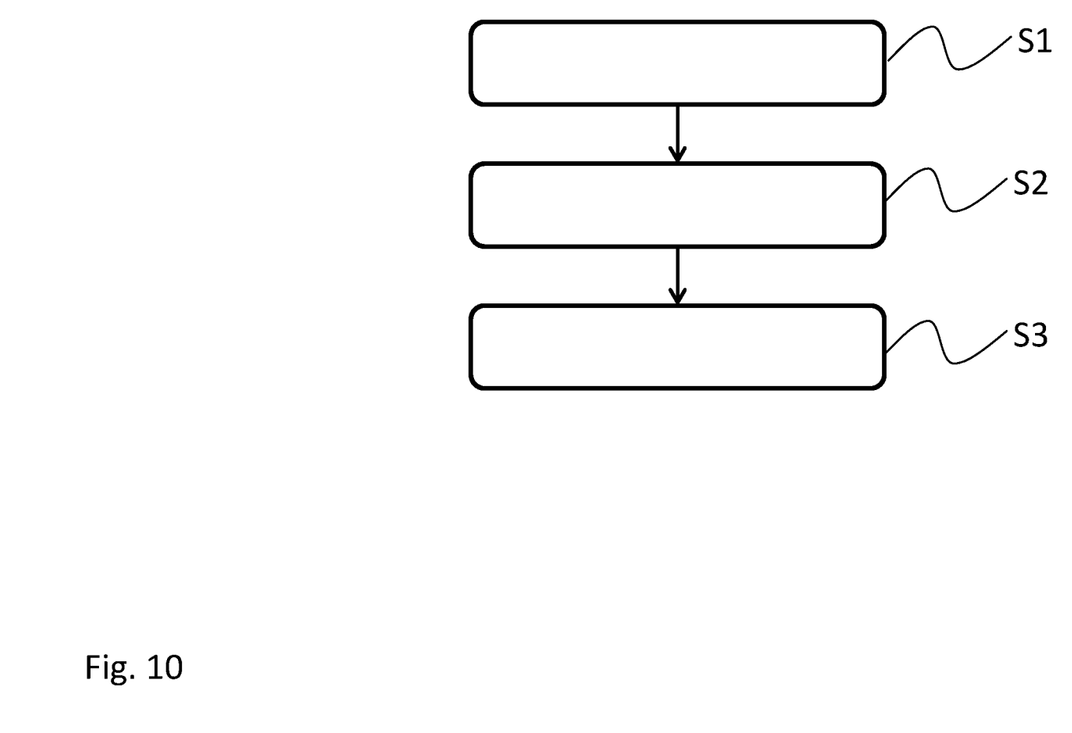
FIG. 10 is a flow chart of an embodiment of a method in accordance with the present invention.

FIG. 10 shows a flow chart of an exemplary execution of the inventive method for manufacturing an assembly 550.

In a first step S1, a component carrier 551 is coupled to a coupling device 100, 200, 300, 400, 500. In a second step S2, cable ends 558, 559, 560 are inserted into corresponding openings 107, 108, 109, 110, 111, 112, 207, 208, 209, 210, 211, 212, 307, 308, 309, 310, 311, 312, 549 of coupling device 100, 200, 300, 400, 500. Finally, in a third step S3, cable ends 558, 559, 560 are mechanically fixedly and electrically conductively connected to corresponding contact elements of component carrier 551, for example, by a soldering step, in particular by flow or wave soldering.

In a preferred execution of the method, cable ends 558, 559, 560 are mechanically fixed in a positioning unit 556, 557 prior to insertion S2. Furthermore, cable ends 558, 559, 560 may, for example, be treated in a tin bath; i.e., be tinned, so that cable ends 558, 559, 560 are covered with a tin coating. This facilitates the subsequent soldering of cable ends 558, 559, 560. It is understood that, depending on the method of contacting, cable ends 558, 559, 560 may also be stripped prior to insertion S2.

Prior to insertion S2, cable ends 558, 559, 560 may also be provided with a mechanical connecting element which is disposed around the cable of cable unit 552, 553. Such a mechanical connecting element may be, for example, an injection-molded part and may mechanically engage, e.g., via latching means, with a coupling means 215 of coupling device 100, 200, 300, 400, 500. Moreover, cable ends 558, 559, 560 may be provided with a shield.

Since the devices and methods described in detail above are exemplary embodiments, they can be modified in the usual way by those skilled to a large extent, without departing from the scope of the invention. In particular, the mechanical arrangements and relative proportions of the individual elements are merely exemplary.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

100, 200, 300, 400, 500 coupling device
101, 201, 301, 401, 501 base plate
102, 202, 302, 402 connecting device
103, 104, 105, 106 latching hook
203, 204 latching hook
303, 304, 305, 306 latching hook
403, 404, 504, 505 latching hook
107, 108, 109, 110, 111, 112 opening
207, 208, 209, 210, 211, 212 opening
307, 308, 309, 310, 311, 312 opening
113, 213, 313, 413 first side
114, 214, 314, 414 second side
215 coupling means
216, 217 latching hook
218 receiving-space boundary
219 receiving space
325, 326 spacer element
327, 328 thickness
430 fastening element
431, 432 latching hook
540, 541, 542, 543, 544, 545 latching hook
546 receiving-space boundary
547 covering device
548 fastening element
549 opening
550 assembly
551 component carrier
552, 553 cable unit
554, 555 cable
556, 557 positioning unit/mechanical connecting element
558, 559, 560 cable end
S1, S2, S3 method steps

What is claimed is:

1. A coupling device for coupling a plurality of cable units to a component carrier, the coupling device comprising:
   a base plate that is flat in at least one plane;
   a connecting device disposed on a first side of the base plate and configured to mechanically couple the base plate to the component carrier;
   an opening extending through the base plate for each cable end of a plurality of cable ends of the cable units, the opening in each case being disposed on the base plate at a position corresponding to the respective cable unit; and
   a plurality of covering devices originating at and extending away from the base plate.

2. The coupling device as recited in claim 1, further comprising coupling means for each of the cable units, each of the coupling means being disposed on a second side of the base plate opposite the first side and being configured to receive and mechanically fix the respective cable unit in a corresponding receiving space.

3. The coupling device as recited in claim 2, further comprising a receiving-space boundary for each of the receiving spaces, each of the receiving-space boundaries having a unique predetermined geometry.

4. The coupling device as recited in claim 1, further comprising at least one mechanical positioning element that is configured to enable coupling of the connecting device to the component carrier only when the coupling device is disposed in a predetermined position on the component carrier.

5. The coupling device as recited in claim 1, wherein each of the openings in the base plate taper in cross section from a second side to the first side, the second side being opposite to the first side.

6. The coupling device as recited in claim 5, wherein each of the openings has a stop at its end located on the first side of the base plate.

7. The coupling device as recited in claim 1, further comprising a plurality of spacer elements arranged on the first side of the base plate and having a predetermined thickness.

8. The coupling device as recited in claim 1, further comprising a plurality of fastening elements configured to mechanically couple the coupling device to an external receptacle.

9. A for coupling a plurality of cable units to a component carrier, the coupling device comprising:
 a base plate that is flat in at least one plane;
 a connecting device disposed on a first side of the base plate and configured to mechanically couple the base plate to the component carrier;
 an opening extending through the base plate for each cable end of a plurality of cable ends of the cable units, the opening in each case being disposed on the base plate at a position corresponding to the respective cable unit; and
 a plurality of shielding openings for at least one of the cable units, the shielding openings extending through the base plate and being configured to receive contacts of a shield of the at least one cable unit.

10. An assembly comprising:
 a plurality of cable units, each having a plurality of cable ends;
 a flat component carrier having a contact element for each of the cable ends; and
 a coupling device for coupling the plurality of cable units to the component carrier, the coupling device comprising:
  a base plate that is flat in at least one plane,
  a connecting device disposed on a first side of the base plate and configured to mechanically couple the base plate to the component carrier,
  an opening extending through the base plate for each cable end of the plurality of cable ends of the cable units, the opening being disposed in each case on the base plate at a position corresponding to the respective cable unit, wherein the coupling device is disposed between the cable units and the component carrier and is mechanically coupled at least to the component carrier, and
  a plurality of covering devices originating at and extending away from the base plate,
 wherein each of the cable ends extend through the respective opening of the coupling device to the respective contact element so as to be electrically coupled to the respective contact element.

11. The assembly as recited in claim 10, further comprising coupling means mechanically coupled to the cable units.

12. The assembly as recited in claim 10, wherein:
 at least one of the cable units has a positioning unit which is configured to mechanically fix the cable ends of the cable unit in a predetermined position, and/or
 at least one of the cable units has a mechanical connecting element which is disposed around a cable of the at least one cable unit and is configured to mechanically engage with a coupling means of the coupling device, and/or
 at least one of the cable units has a shield.

13. A method for manufacturing an assembly, the method comprising:
 coupling a component carrier to a coupling device for coupling a plurality of cable units to a corresponding plurality of receiving spaces of the component carrier, the coupling device comprising:
  a base plate that is flat in at least one plane,
  a connecting device disposed on a first side of the base plate and configured to mechanically couple the base plate to the component carrier,
  an opening extending through the base plate for each cable end of a plurality of cable ends of the cable units, the opening being disposed in each case on the base plate at a position corresponding to the respective cable unit, and
  a receiving space boundary that projects from a second side of the base plate opposite the first side for each of the receiving spaces, each of the receiving space boundaries having a unique geometry and each of the corresponding cable units having a corresponding geometry;
 inserting the cable ends into the respective openings of the coupling device such that each of the cable units are received in the corresponding receiving space boundary having the unique geometry; and
 electrically coupling the cable ends to corresponding contact elements of the component carrier.

14. The method as recited in claim 13,
 wherein the cable ends are mechanically fixed in a positioning unit prior to insertion, and/or
 wherein the cable ends are stripped and/or tinned prior to insertion, and/or
 wherein the cable ends are provided with a shield prior to insertion, and/or
 wherein, prior to insertion, the cable ends are each provided with a mechanical connecting element which is disposed around a cable of the respective cable unit and is configured to mechanically engage with a coupling means of the coupling device, and/or
 wherein the electric coupling includes flow or wave soldering.

15. An assembly comprising:
 a plurality of cable units, each having a plurality of cable ends;
 a flat component carrier having a contact element for each of the cable ends; and
 a coupling device for coupling the plurality of cable units to the component carrier, the coupling device comprising:
  a base plate that is flat in at least one plane,
  a connecting device disposed on a first side of the base plate and configured to mechanically couple the base plate to the component carrier,
  an opening extending through the base plate for each cable end of the plurality of cable ends of the cable units, the opening being disposed in each case on the base plate at a position corresponding to the respective cable unit, wherein the coupling device is disposed between the cable units and the component carrier and is mechanically coupled at least to the component carrier, and a plurality of shielding openings for at least one of the cable units, the shielding openings extending through the base plate and being configured to receive contacts of a shield of the at least one cable unit, wherein each of the cable ends extend through the respective opening of the coupling device to the respective contact element so as to be electrically coupled to the respective contact element.

16. A coupling device for coupling a plurality of cable units to a corresponding plurality of receiving spaces of a component carrier, the coupling device comprising:

a base plate that is flat in at least one plane;

a connecting device disposed on a first side of the base plate and configured to mechanically couple the base plate to the component carrier;

an opening extending through the base plate for each cable end of a plurality of cable ends of the cable units, the opening in each case being disposed on the base plate at a position corresponding to the respective cable unit; and a receiving space boundary that projects from a second side of the base plate opposite the first side for each of the receiving spaces, each of the receiving space boundaries having a unique geometry.

17. The coupling device as recited in claim 16, wherein the receiving space boundaries project vertically from the second side of the base plate so as to form a wall, collar or rim that at least partially surrounds the respective receiving space.

18. The coupling device as recited in claim 17, wherein the receiving space boundaries include integral latching elements that project vertically from the second side of the base plate, the latching elements being configured to couple the respective cable units in the corresponding receiving spaces.

19. The coupling device as recited in claim 16, wherein the receiving space boundaries are integrally formed in one piece.

20. An assembly comprising:

a plurality of cable units, each having a plurality of cable ends;

a flat component carrier having a contact element for each of the cable ends; and a coupling device for coupling the plurality of cable units to a corresponding plurality of receiving spaces of the component carrier, the coupling device comprising:

a base plate that is flat in at least one plane, a connecting device disposed on a first side of the base plate and configured to mechanically couple the base plate to the component carrier, an opening extending through the base plate for each cable end of the plurality of cable ends of the cable units, the opening being disposed in each case on the base plate at a position corresponding to the respective cable unit, wherein the coupling device is disposed between the cable units and the component carrier and is mechanically coupled at least to the component carrier, and a receiving space boundary that projects from a second side of the base plate opposite the first side for each of the receiving spaces, each of the receiving space boundaries having a unique geometry and each of the corresponding cable units having a corresponding geometry;

wherein each of the cable units are received in the corresponding receiving space boundary having the unique geometry and each of the cable ends extend through the respective opening of the coupling device to the respective contact element so as to be electrically coupled to the respective contact element.

21. The assembly as recited in claim 20, wherein each of the receiving space boundaries include a latching element, and wherein an end of each of the cable units includes a jacket that is inserted into the respective receiving space and latched into engagement with the respective latching element such that the jackets act as positioning units and mechanical connecting elements.

* * * * *